United States Patent

[11] 3,579,147

[72] Inventors Kenneth H. Brown
Phoenix;
Robert C. Fitting, Scottsdale, Ariz.
[21] Appl. No. 789,903
[22] Filed Jan. 8, 1969
[45] Patented May 18, 1971
[73] Assignee The United States of America as represented by the Administrator of the National Aeronautics and Space Administration

[54] PHASE MODULATOR
4 Claims, 1 Drawing Fig.

[52] U.S. Cl. .......... 332/29, 332/30
[51] Int. Cl. .......... H03c 3/12
[50] Field of Search .......... 331/36 (C), 177 (V); 332/29, 30, 30 (V), 43; 333/31, 70 (B)

[56] References Cited
UNITED STATES PATENTS
3,400,342 9/1968 Putnam .......... 333/31
3,440,570 4/1969 Kasper .......... 333/31X

*Primary Examiner*—Roy Lake
*Assistant Examiner*—Lawrence J. Daal
*Attorney*—Mueller, Aichele and Rauner

ABSTRACT: A pair of tuned lines are coupled to a carrier signal source and a load through a quarter-wave coupler. The electrical length of the lines are electrically altered to phase modulate the carrier supplied by the source through the coupler to the load. Varactor diodes and a variable inductance in each of the lines vary the line electrical lengths such that there is a linear modulation of the carrier. The arrangement is such that the energy reflected from the two lines have phases opposing at the source such that there is no power supplied at the input coupler port while all of the reflected power from the two lines is supplied in phase through the coupler output port to the load.

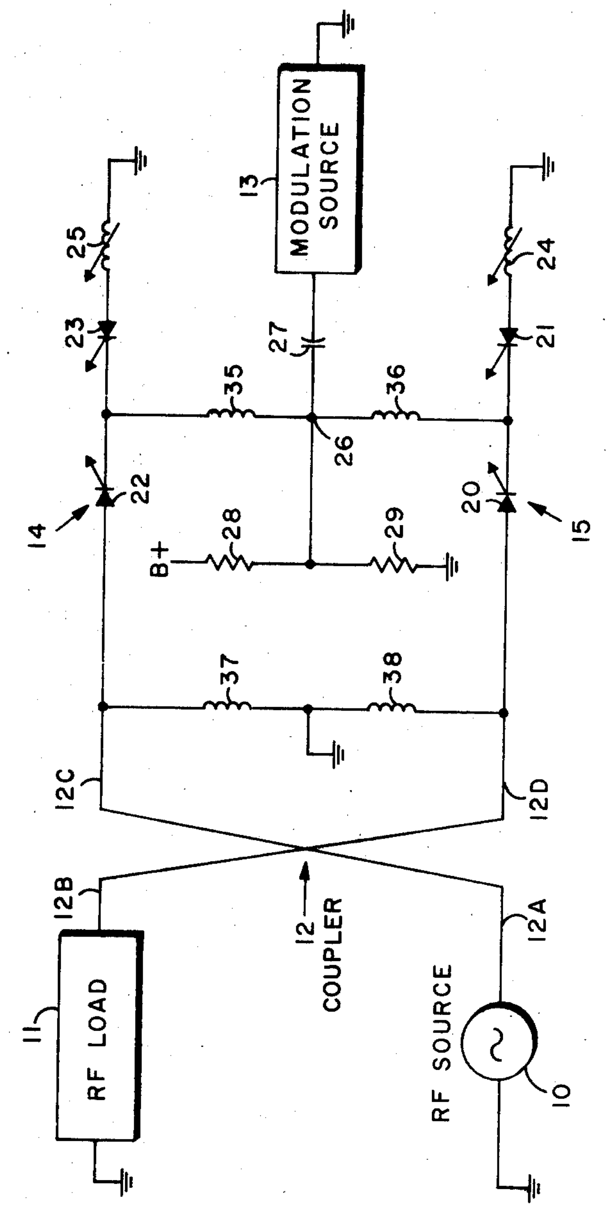
INVENTORS
KENNETH H. BROWN
ROBERT C. FITTING
BY
Mueller, Aichele & Rauner
ATTORNEYS

PHASE MODULATOR

BACKGROUND OF THE INVENTION

This invention relates to a phase modulator and particularly to a phase modulator utilizing tuned variable length electrical lines.

Phase modulators are used in many FM transmitters and receivers. Generally, the higher the frequency at which such a modulator can operate, the smaller the size of components are utilized. Such compactness is highly desired in electronic apparatus. The phase modulator should have a large linear phase shift, such as up to about a radian peak modulation. At lower frequencies, of course, the modulation index can be smaller. Therefore, at the higher frequencies of phase modulation, Q is a problem in that all of the components must be carefully selected and carefully assembled to ensure that Q is maintained for effecting linear phase modulation. Insertion losses must be kept to a minimum in all instances.

SUMMARY OF THE INVENTION

It is an object of this invention to provide a low loss phase modulator of improved design.

A feature of the invention is the connection of two electrical lines having an inductive element and a varactor diode which linearize phase modulation through use of reflected energy to a quarter-wave coupler.

A quarter-wavelength four port coupler connects an RF source to a load respectively through input and output ports. The two other ports of the coupler are referred to as quadrature ports, meaning that the signals thereat received from the input port have a 90° phase relationship. A pair of tuned lines are respectively connected to the quadrature ports. A source of modulation signals electrically varies the electrical length of the lines such that the energy reflected from the lines into the quadrature ports for transmission to the load varies in phase in accordance with the electrical line length variation. The electrical line reactance is formed by capacitors and inductors. In one embodiment, the capacitors consist of varactor diodes which are reverse biased and have their reverse bias modulated by the modulation source to thereby vary the capacitance and hence the electrical length of the line. The inductors are selected to compensate for the nonlinearities introduced into the phase modulation because of the nonlinear phase electrical line length relationship as well as the nonlinear capacitance reverse bias voltage relationship of the varactor diodes. Inductors are preferably made variable such that the lines can be tuned to form a linear modulator. The varactor diodes are connected such that all diodes are in parallel circuit relationship with respect to the modulation source such that all capacitances of the various diodes vary simultaneously in an identical manner. The diodes are preferably closely matched and have a good Q.

THE DRAWING

The attached FIGURE shows in diagrammatic form an illustrative embodiment of the present invention.

DETAILED DESCRIPTION OF THE ILLUSTRATIVE EMBODIMENT

Referring to the drawing, a source 10 of radio frequency signals supplies RF energy to load 11 through coupler 12 wherein the RF signal is modulated by modulation source 13 supplied signals. The RF signals are supplied to input port 12A and thence are transmitted to a set of lines 14 and 15 wherein the electrical line length is varied as will be explained. Reflected energy is supplied through ports 12C and 12D which then is coupled to output port 12B to supply load 11 a phase-modulated signal. The arrangement is such that the reflected energy supplied through ports 12C and 12D are in phase at output port 12B and out-of-phase at input port 12A. In accordance therewith, the signals are cancelled at input port 12A, thereby supplying no reflected energy to source 10.

Since the signals at port 12D are in-phase, maximum phase-modulated RF energy is supplied to load 11. It may be noted that the configuration is symmetrical. In accordance therewith RF source 10 may be connected to either ports 12A or 12B and load 11 connected to the other port, i.e., ports 12A and 12B may be interchanged with successful operation.

Coupler 12 can be of any microstrip design wherein the coupler is a quarter-wavelength long of the radio frequency signal. Such couplers are well known and will not be further described for that reason. In the illustrative embodiment it was desired that a 3DB quarter-wavelength coupler be used in connection with the two tuned lines 14 and 15.

Lines 14 and 15 have an electrical length determined in part by the varactors 20, 21 and inductor 24 for line 15, and varactors 22 and 23 and inductor 25 for line 14. The electrical length of lines 14 and 15 is also affected by the physical length of the structure (not shown) supporting the varactor and inductor elements as is well-known in the art. The RF energy reflected to ports 12C and 12D has a phase determined by the electrical length of lines 14 and 15. By modulating the capacitance of the varactors in these lines the electrical length of the lines are modulated, therefore, the phase of the RF signal is phase-modulated.

The variation of electrical line length is by modulation signals on line 26 supplied from source 13 through DC isolating capacitor 27. The four varactor diodes 20, 21, 22 and 23 are in parallel circuit relationship between modulation source line 26 and ground reference potential. The modulation of capacitance of all the varactor diodes is the same. The varactor diodes are reverse biased by B+ supply connected through voltage dividers 28 and 29 to modulation source line 26. In accordance therewith the electrical line length of lines 14 and 15 is symmetrically altered by modulation source 13 signals.

Lines 14 and 15 present an electrical line length to ports 12C and 12D which length is modulated by the variation of capacitance of the varactor diodes 20 and 21 by the modulation source signals. The electrical line length causes a change in phase of the RF signal supplied thereto as is well-known in the art. The reflected signals are phase modulated and as coupled to input port 12A are out-of-phase when the impedances of the lines 14 and 15 are equal. That is, the reflected energy at port 12B is 180° out-of-phase with respect to the energy supplied to input port 12A from port 12C. However, because of the coupler action, the reflected energy at ports 12C and 12D are in phase at output port 12B. However, if the electrical impedances of lines 14 and 15 are somewhat unequal, this phase relationship is altered such that the phase relationship at input port 12A is not 180°. Similarly, there is a slight out-of-phase relationship at output port 12B. This latter described relationship causes distortion in the phase modulator wave and reduces the power throughout. Therefore, it is quite important that the electrical impedances of lines 14 and 15 be made equal. Accordingly, for optimum linear operation, the varactor diodes 20, 21, 22 and 23 should be carefully matched as to their voltage capacitance characteristics.

It is well known that the variation of capacitance with respect to the variation of reverse bias voltage across the varactor diode is nonlinear. Further, it is known that the phase variation of a signal caused by a variation in electrical length of a line is a tangential function. That is, it is quite nonlinear. To linearize the phase modulation of the present modulator, inductors 24 and 25, both variable, are connected in series circuit relationship to electrical lines 14 and 15. In one constructed embodiment operating at a 500 megahertz radio signal frequency, inductors 24 and 25 were microstrip lines. The length thereof was adjusted in accordance with known microstrip techniques. At lower frequencies, the inductances 24 and 25 may be lumped components, such as a slug tuned inductor. It is known that the inductive impedance varies inversely with respect to variation of capacitive impedance. Inductors 24 and 25 are carefully selected such as to compensate for the voltage versus capacitance characteristics of the diodes in the respective lines as well as the tangential variation of phase with respect to a variation of electrical line length. By so carefully selecting inductors 24 and 25 and adjusting them after assembly, a linear phase modulator is provided.

Radio frequency chokes 35 and 36 are added to RF isolate lines 14 and 15 respectively from the bias source and the modulation source 13. The radio frequency chokes 37 and 38 are provided to complete a DC path between the B+ supply for reverse biasing the diodes 20 and 22. These chokes, by providing a DC return to ground, also prevent the DC from affecting operation of source 10 and load 11 via coupler 12. Diodes 20 and 22, in addition to providing a variable capacitance to lines 14 and 15, serve as blocking capacitors to isolate the DC source from dividers 28 and 29 from supplying DC current to RF source 10 and RF load 11. Diodes 20 and 22 could be replaced by fixed DC blocking capacitors. Alternatively, diodes 20 and 22 could be eliminated with fixed blocking capacitors being connected at RF source 10 and load 11 terminals. In this latter alternative connection, RF chokes 37 and 38 may be dispensed with. Alternatively, diodes 20 and 22 may be left in with diodes 21 and 23 being replaced by fixed capacitors.

The operation of the coupler 12 with respect to lines 14 and 15 acts as a four port device where an incoming signal at port 12A is divided into two outputs at ports 12C and 12D which are in phase quadrature (90° out-of-phase) and are 3DB below the input power level for a 3DB coupler. A typical insertion loss is about 0.5 db. with the two quadrature outputs at 12C and 12D being balanced within 0.5 db. Output port 12B is connected to load 11 which has a resistive impedance which should be equal to the hybrid characteristic impedance and will receive no power unless lines 14 and 15 have a VSWR other than one. Isolation between input port 12A and output port 12B of 30 to 50 db. is achievable.

When lines 14 and 15 have equal impedances, the input VSWR at port 12A remains low. If the lines 14 and 15 appear shorted, the RF power reflected at port 12C divides between ports 12A and 12B while reflected power from port 12D also divides equally between ports 12A and 12A However, it can be shown mathematically, which is beyond the necessary teaching for this invention, that the reflected power components are out-of-phase at the input port 12A but are in phase at output port 12B. Instead of shorting the lines 14 and 15, the lines are terminated in the variable reactances presented by the varactor diodes and the two variable inductances. Since no power is absorbed in a pure reactance, most of the input power is reflected to be supplied through output port 12B thence to RF load 11. The phase relationship between the signal at input port 12A and the output port 12B is dependent on the diode reactance presented in lines 14 and 15.

The reflection coefficient in terms of terminating impedance is a tangential function of the variation of electrical length of lines 14 and 15. If $\theta$ is the reflection angle, i.e., the phase shift, $Z_O$ the characteristic impedance and $Z_T$ the terminating impedance and angle $\theta$ is:

$$\theta=2\tan^{11}Z_O/Z_T \qquad (1)$$

One known formula for varactor diode capacitance versus voltage characteristics is:

$$C=KV^{-\gamma} \qquad (2)$$

wherein $\gamma$ is between one third and one half depending upon the manufacturing process of the particular diode, i.e., the junction characteristics; C is the capacitance; K is a constant and V is the reverse voltage.

To determine the value of the inductors 24 and 25 for linearizing phase modulation operations, one must take the first derivative of $\theta$ with respect to voltage to determine the percentage nonlinearity of any desired phase modulation operation. Inductors can be either a series inductance or shunt inductance for linearization. The illustrated embodiment uses a series inductor. Tests have shown that a series inductance works much better than a shunt inductance in linearization of the illustrated modulator. This is desirable even though a shorted transmission line can be used to make a good shunt inductance.

Accordingly, design criteria for a series inductor only is given herein. With respect to the phase modulation index $\theta$ in radians as a function of a series inductance $\iota$ is, $$\theta=2\tan^{-1}\frac{Ro}{\omega i-V\gamma/\omega\chi} \qquad (3)$$

wherein R$o$ is the hybrid characteristic impedance, V is the voltage across the diode $\omega$ is the frequency in radians and X is the varactor reactance (center, i.e., for no modulation). The first derivative of $\theta$ with respect to voltage in radians per volt is:

$$\frac{d\theta}{dV}=\frac{2Ro\gamma V^{\gamma-1}}{\omega\chi\left[\omega i-\left(\frac{V}{\omega\chi}\right)+Ro^2\right]}$$

From the above equations a phase modulator can be designed using known microstrip techniques.

At half-radian peak variation in phase there is only plus or minus 1 percent error in the illustrated modulator. In accordance therewith cascading two or more of these phase modulators can result in improved linearity at the expense of additional circuits. For example, a 0.5 radian peak variation in phase with only a 0.6 percent distortion can be obtained by cascading two identical phase modulators of this invention.

Another characteristic of the illustrated phase modulator is that there is amplitude modulation present on the output for a constant voltage modulating signal. Such amplitude variation arises if the diode Q's vary over the dynamic range of the modulating signal. This can be a problem because present varactors do not have a sufficiently high Q at 500 megahertz. With the varying Q somewhat with reverse voltage, therefore, it is extremely important to have very high Q varactor diodes.

We claim:

1. A phase modulator, including in combination:

a coupler having input, output and a pair of quadrature ports, first and second transmission lines respectively connected to said quadrature ports, said transmission lines each having an impedance means including series connected variable reactance means of the capacitive and inductive-type, modulation means connected to said capacitive reactance means for electrically varying same for altering the electrical length of said lines, said lines being symmetrically disposed with respect to said modulation source such that the electrical length of both lines varies identically, and the impedance means of said lines being matched as to their respective impedances and variation of reactive impedances with respect to said signals from said modulation source.

2. A phase modulator including the combination:

a quarter wave coupler having input and output ports and a pair of quadrature ports for receiving reflected energy to be supplied to said output ports, first and second transmission lines respectively connected to said quadrature ports, said transmission lines being identically constructed and each including its own series inductor and capacitor element for terminating said lines, a modulation signal source connected to both said lines for completing a pair of parallel circuits between said series connected inductor elements and capacitor elements in each said line for applying bias voltage thereacross in accordance with modulation signals, said capacitor element being responsive to modulation signals for varying the capacitive reactance thereof for thereby varying the effective electrical length of both said lines identically to effect phase modulation of the signals being supplied through said coupler.

3. The subject matter of claim 2 further including third and fourth capacitive reactance elements interposed between said quadrature ports and said series connected capacitor elements and inductor elements and poled to be reverse biased by said modulation signals.

4. The subject matter of claim 3 wherein said capacitive reactive elements are connected in common to said modulation signal points through radio frequency chokes.